(12) United States Patent
Mitzi et al.

(10) Patent No.: US 9,390,919 B2
(45) Date of Patent: Jul. 12, 2016

(54) METHOD OF FORMING SEMICONDUCTOR FILM AND PHOTOVOLTAIC DEVICE INCLUDING THE FILM

(75) Inventors: David B. Mitzi, Mahopac, NY (US); Teodor K. Todorov, Yorktowin Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/552,080

(22) Filed: Jul. 18, 2012

(65) Prior Publication Data
US 2012/0279565 A1 Nov. 8, 2012

Related U.S. Application Data

(62) Division of application No. 12/606,210, filed on Oct. 27, 2009.

(51) Int. Cl.
*H01L 21/02* (2006.01)

(52) U.S. Cl.
CPC ...... *H01L 21/02568* (2013.01); *H01L 21/0237* (2013.01); *H01L 21/02601* (2013.01); *H01L 21/02628* (2013.01); *Y02E 10/52* (2013.01)

(58) Field of Classification Search
CPC ... H01L 31/00; H01L 31/032; H01L 31/0326; H01L 31/18; H01L 31/1864; H01L 31/1876; H01L 31/02; H01L 31/0248; H01L 31/0256; H01L 31/0272; H01L 31/04; H01L 31/072; H01L 31/1844
USPC .................................. 136/252, 260, 264, 265
See application file for complete search history.

(56) References Cited

U.S. PATENT DOCUMENTS

| | | | |
|---|---|---|---|
| 4,242,374 A | 12/1980 | Sansregret | |
| 5,436,204 A | 7/1995 | Albin et al. | |

(Continued)

FOREIGN PATENT DOCUMENTS

| | | |
|---|---|---|
| CN | 101000865 A | 7/2007 |
| JP | 62030693 A | 2/1987 |

(Continued)

OTHER PUBLICATIONS

Definition of "disperse" by Merriam-Webster retrieved from http://www.merriam-webster.com/dictionary/disperse on Jul. 22, 2013.*

(Continued)

*Primary Examiner* — Christina Chern
(74) *Attorney, Agent, or Firm* — Cantor Colburn LLP; Vazken Alexanian

(57) ABSTRACT

A method of depositing a kesterite film which includes a compound of the formula: $Cu_{2-x}Zn_{1+y}Sn(S_{1-z}Se_z)_{4+q}$, wherein $0 \leq x \leq 1$; $0 \leq y \leq 1$; $0 \leq z \leq 1$; $-1 \leq q \leq 1$. The method includes contacting hydrazine, a source of Cu, and a source of at least one of S and Se forming solution A; contacting hydrazine, a source of Sn, a source of at least one of S and Se, and a source of Zn forming dispersion B; mixing solution A and dispersion B under conditions sufficient to form a dispersion which includes Zn-containing solid particles; applying the dispersion onto a substrate to form a thin layer of the dispersion on the substrate; and annealing at a temperature, pressure, and length of time sufficient to form the kesterite film. An annealing composition and a photovoltaic device including the kesterite film formed by the above method are also provided.

4 Claims, 4 Drawing Sheets

(56) References Cited

U.S. PATENT DOCUMENTS

| | | | |
|---|---|---|---|
| 5,858,121 | A | 1/1999 | Wada et al. |
| 5,958,358 | A | 9/1999 | Tenne et al. |
| 6,107,562 | A | 8/2000 | Hashimoto et al. |
| 7,094,651 | B2 | 8/2006 | Mitzi et al. |
| 7,390,715 | B2 | 6/2008 | Ou et al. |
| 7,393,699 | B2 | 7/2008 | Tran |
| 7,534,490 | B1 | 5/2009 | Goh et al. |
| 2004/0202789 | A1 | 10/2004 | Patil et al. |
| 2005/0009225 | A1 | 1/2005 | Mitzi et al. |
| 2005/0043184 | A1 | 2/2005 | McCleskey et al. |
| 2005/0205958 | A1 | 9/2005 | Taniguchi et al. |
| 2007/0160747 | A1 | 7/2007 | Mitzi et al. |
| 2008/0178927 | A1* | 7/2008 | Brezoczky et al. ........... 136/248 |
| 2008/0238294 | A1 | 10/2008 | Xu et al. |
| 2009/0098481 | A1 | 4/2009 | Nakahira |
| 2009/0107550 | A1 | 4/2009 | Van Duren et al. |
| 2009/0114908 | A1 | 5/2009 | Hirai et al. |
| 2009/0205714 | A1 | 8/2009 | Kuhnlein et al. |
| 2011/0097496 | A1 | 4/2011 | Mitzi et al. |
| 2012/0279565 | A1 | 11/2012 | Mitzi et al. |
| 2013/0125977 | A1 | 5/2013 | Ahmed et al. |

FOREIGN PATENT DOCUMENTS

| | | | | |
|---|---|---|---|---|
| JP | 2007185764 | A | 7/2007 | |
| JP | 2009105130 | A | 5/2009 | |
| JP | 2012527402 | A | 11/2012 | |
| WO | 2007134843 | A2 | 11/2007 | |
| WO | WO 2007134843 | A2 * | 11/2007 | .............. H01L 31/00 |
| WO | 2008057119 | A1 | 5/2008 | |

OTHER PUBLICATIONS

Q. Guo, "Synthesis of Cu2ZnSnS4 Nanocrystal Ink and its Use for Solar Cells," J. Am. Chem. Soc. 131, pp. 11672-11673, 2009.
H. Katagiri, et al, "Development of CZTS-based Thin Film Solar Cells," Thin Solid Films 517, pp. 2455-2460, 2009.
Kishore, "Preparation and Characterization of Spray-Deposited Cu2ZnSnS4 Thin Films," Solar Energy Materials and Solar Cells, vol. 93, No. 8, pp. 1230-1237, Aug. 2009.
Min, "Influences of Synthesizing Temperatures on the Properties of Cu2ZnSnS4 Prepared by Sol-Gel Spin-Coated Deposition," Journal of Soi-Gel Science and Technology, vol. 52, No. 1, pp. 65-68, May 2009.
Mitzi, "Hydrazine-based Deposition Route for Device Quality CIGS Films," Thin Solid Films, Elsevier-Sequoia, SA, vol. 517, No. 7, pp. 2158-2162, Feb. 2009.
Mitzi, "Towards Marketable Efficiency Solution-Processed Kesterite and Chalcopyrite Devices," 35th IEEE Photovoltaic Specialists Conference, pp. 640-645, Jun. 2010.
Steinhaten, "Synthesis of Cu2ZnSnS4 Nanocrystals for Use in Low-Cost Photovoltaics," Journal of the American Chemical Society, vol. 131, No. 35, pp. 12554-12555, Sep. 2009.
T. Todorov, et al., "Cu2ZNSnS4 Films Deposited by a Soft-Chemistry Method," Thin Solid Films 517, pp. 2541-2544, 2009.
Tanaka, et al., "CU2ZnSnS4 Thin Film Solar Cells Prepared by Non-Vacuum Processing," Solar Energy Materials and Solar Cells 93, pp. 583-587, 2009.
Amendment to Office Action filed in U.S. Appl. No. 12/606,210, dated Jul. 27, 2012; 12 pages.
Amendment to Office Action Filed in U.S. Appl. No. 12/606,210, dated Nov. 26, 2012; 11 pages.
Advisory Action issued in U.S. Appl. No. 12/606,210, dated Dec. 12, 2012; 3 pages.
Amendment to Office Action filed in U.S. Appl. No. 12/718,039, dated Apr. 23, 2013; 13 pages.
Amendment to Office Action filed in U.S. Appl. No. 12/606,210, dated Dec. 31, 2012; 12 pages.
Final Office Action issued in U.S. Appl. No. 12/606,210, dated Oct. 5, 2012; 16 pages.
Interview Summary issued in U.S. Appl. No. 12/606,210 dated Jan. 10, 2013; 3 pages.
Non Final Office Action issued in U.S. Appl. No. 12/606,210, dated May 10, 2012; 22 pages.
Request for Continued Examination Filed in U.S. Appl. No. 12/606,210, filed Jan. 2, 2013; 3 pages.
Response to Restriction Requirement filed in U.S. Appl. No. 12/606,210 dated Apr. 23, 2012; 9 pages.
Response to Restriction Requirement filed in U.S. Appl. No. 12/718,039, dated Aug. 20, 2012; 9 pages.
Restriction Requirement issued in U.S. Appl. No. 12/606,210 dated Mar. 29, 2012; 13 pages.
Restriction Required issued in U.S. Appl. No. 12/718,039, dated Aug. 3, 2012; 7 pages.
Terminal Disclaimer Filed in U.S. Appl. No. 12/606,210, dated Nov. 27, 2012; 2 pages.
Final Office Action issued in U.S. Appl. No. 12/718,039 dated Jul. 24, 2013; 16 pages.
Examination Report issued in Great Britain Application No. GB1201821.4 issued Jul. 10, 2013; 3 pages.
Final Office Action issued in U.S. Appl. No. 12/606,210 dated Jan. 27, 2014; 21 pages.
Steinhagen, "Synthesis of Cu2ZnSnS4 Nanocrystals for Use in Low-Cost Photovoltaics," Journal of the American Chemical Society, vol. 131; 12554-12555, Jul. 2009.
Examination Report issued in Great Britain Application No. GB1201821.4, dated Nov. 15, 2013; 3 pages.
Non-Final Office Action issued in U.S. Appl. No. 12/606,210 dated Sep. 30, 2013; 23 pages.
Guo, "Synthesis of Cu2ZnSnS4 Nanocrystal Ink and its Use for Solar Cells," JACS Communications, 131, Published on WEb Jul. 31, 2009, p. 11672-11673.
Colombara, et al., "Electrodeposition of kesterite thin films for photovaltaic applications: Quo vadis?" Phys. Status Solidi A; vol. 212, No. 1, 88-102 (2015); DOI 10.1002/pssa.201431364.

* cited by examiner

METHOD OF FORMING SEMICONDUCTOR FILM AND PHOTOVOLTAIC DEVICE INCLUDING THE FILM

CROSS REFERENCE TO RELATED APPLICATION

The present application is a Divisional application of U.S. patent application Ser. No. 12/606,210, filed on Oct. 27, 2009, incorporated by reference in its entirety.

BACKGROUND

The present invention relates to a liquid-based method for deposition of inorganic films having Cu, Zn, Sn, and at least one of S and Se, and more particularly to a method of deposition of kesterite-type Cu—Zn—Sn—(Se,S) materials and improved photovoltaic devices based on these films.

Large-scale production of photovoltaic devices requires high-throughput technologies and abundant environmentally friendly materials. Thin-film chalcogenide-based solar cells provide a promising pathway to cost parity between photovoltaic and conventional energy sources.

Currently, only Cu(In,Ga)(S,Se)2 and CdTe technologies have reached commercial production and offer over 10 percent power conversion efficiency. These technologies generally employ (i) indium and tellurium, which are relatively rare elements in the earth's crust, or (ii) cadmium, which is a highly toxic heavy metal.

Copper-zinc-tin-chalcogenide kesterites have been investigated as potential alternatives because they are based on abundant elements. However, photovoltaic cells with kesterites, even when produced using high cost vacuum-based methods, have so far achieved at best only <6.7 percent efficiencies, see Katagiri, H. et. al. Development of CZTS-based thin film solar cells; Thin Solid Films 517, 2455-2460 (2009).

K. Tanaka, M. Oonuki, N. Moritake, H. Uchiki, Solar Energy Mater. Sol. Cells 2009, 93, 583-587 describe a solution-based approach for an indium-free material which produced a photovoltaic device with efficiency of only 1%.

T. Todorov, M. Kita, J. Carda, P. Escribano, Thin Solid Films 2009, 517, 2541-2544 describe a deposition approach based on quaternary Cu—Zn—Sn—S precursors formed by reacting metal acetates and chlorides with elemental sulfur in ethylene glycol at 170° C.

Guo et. al, J. AM. CHEM. SOC. 2009, 131, 11672-11673 have reported films deposited by a similar approach, subsequently subjected to selenization treatment. They have also reported that devices based on the Cu2ZnSnSySe1-y films yield efficiencies of 0.74%, a level that is lower than the above solution approach for Cu2ZnSnS4.

However, there are no reports of hydrazine-based deposition approaches of depositing homogeneous chalcogenide layers from dispersions of metal chalcogenides in systems that are not strictly soluble in hydrazine. Further, there are no reports to extend the nanoparticle- and microparticle-based approaches to systems without organic binders in a manner that particle-based precursors can readily react with solution component and form large-grained films with good electrical characteristics.

SUMMARY

The disadvantages associated with the prior art are overcome by embodiments of the present invention by the introduction of hybrid precursor inks including both dissolved and solid components of the targeted material, where the dissolved component acts as a binder, without introducing extraneous elements into the solution that would generally end up as impurities in the final film.

The present method provides a method of depositing a kesterite film including a compound of the formula:

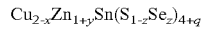

$$Cu_{2-x}Zn_{1+y}Sn(S_{1-z}Se_z)_{4+q}$$

wherein $0 \leq x \leq 1$; $0 \leq y \leq 1$; $0 \leq z \leq 1$; $-1 \leq q \leq 1$ The method includes the steps of contacting hydrazine, a source of Cu, a source of Sn, a source of Zn and a source of at least one of S and Se under conditions sufficient to form a dispersion including Zn-containing solid particles. In a preferred embodiment, the method includes the steps of contacting hydrazine, a source of Cu, and a source of at least one of S and Se forming solution A; contacting hydrazine, a source of Sn, a source of at least one of S and Se, and a source of Zn form dispersion B; mixing solution A and dispersion B under conditions sufficient to form a dispersion including Zn-containing solid particles; applying the dispersion onto a substrate to form a thin layer of the dispersion on the substrate; and annealing at a temperature, pressure, and length of time sufficient to form the kesterite film.

The present invention further provides a composition, which includes a dispersion of Zn-containing solid particles formed from hydrazine, a source of Cu, a source of Sn, a source of Zn, and a source of at least one of S and Se; which when annealed, forms a compound of the formula: Cu2-xZn1+ySn(S1-zSez)4+q wherein $0 \leq x \leq 1$; $0 \leq y \leq 1$; $0 \leq z \leq 1$; $-1 \leq q \leq 1$.

The present invention still further provides a photovoltaic device, including a top electrode having transparent conductive material; an n-type semiconducting layer; a kesterite film on the substrate formed by the above described method; and a substrate having an electrically conductive surface.

The present invention provides a non-vacuum slurry-based coating method that enables fabrication of Cu2ZnSn(Se,S)4 devices with 9.6% percent efficiency, almost an order of magnitude improvement over previous attempts to use high-throughput non-vacuum approaches and sufficient performance enhancement to suggest direct commercial utility for this material system.

The hybrid deposition process combines advantages of both a recently described hydrazine-based solution approach, enabling the incorporation of select metal chalcogenide anions directly in solution, and particle-based deposition, which allows the incorporation of additional otherwise insoluble components. The described modified slurry method enables the high-throughput low-capital-cost fabrication of thin films of different semiconductor materials, ranging from new chalcogenide-based photovoltaic absorbers to a broader range of materials employed in the optical, electronic and other semiconductor industries.

DETAILED DESCRIPTION

Figure 1:
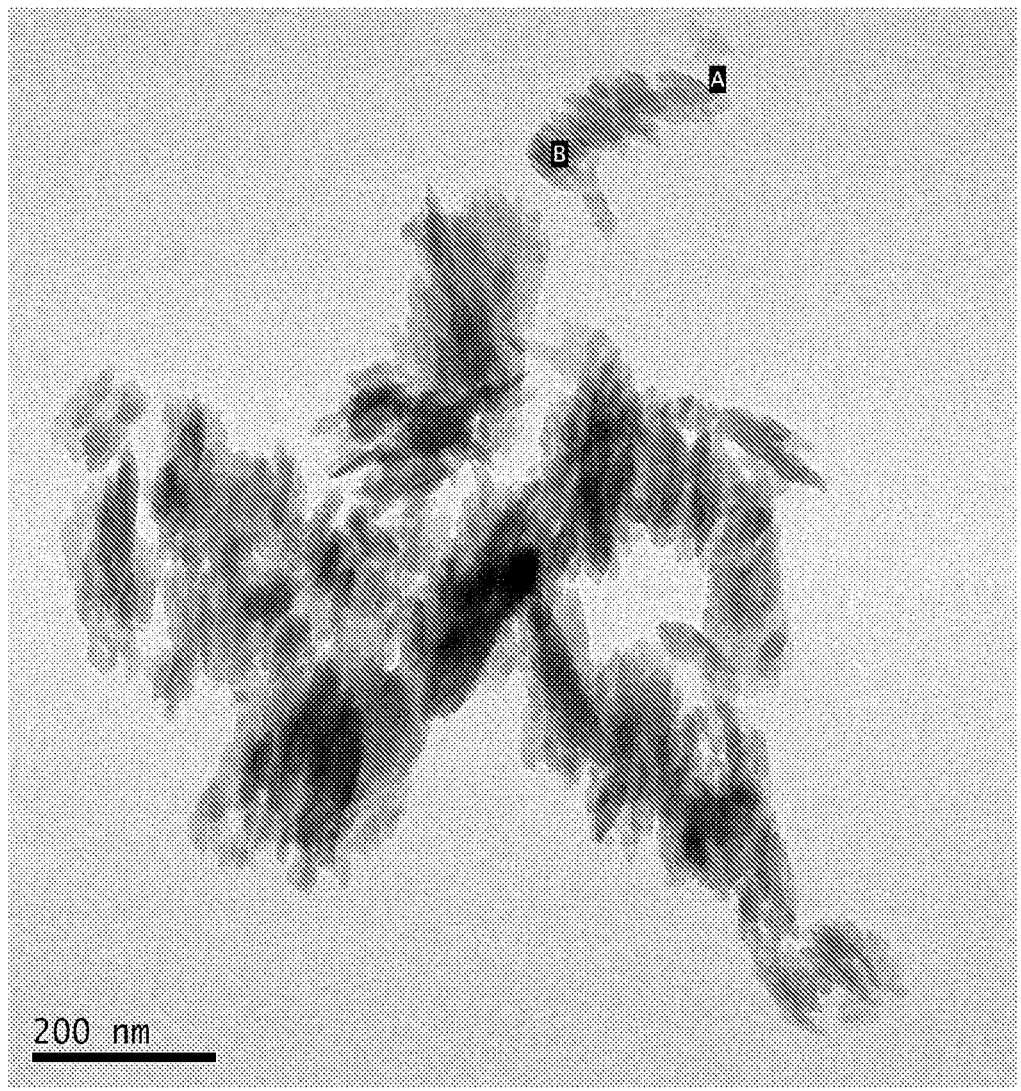
FIG. 1 is a TEM image of solid particles filtered out of the hybrid deposition solution in Example 1.

The details given in this section are non-limiting and for exemplary purpose only, demonstrating various modes of applying the invention. When components of the invention are defined as containing elements, it must be understood that these elements can be present in either isolated or in compound form, (e.g., a Zn-containing component may contain Zn, ZnS, ZnSe or any other known Zn compound).

The present invention provides a liquid (ink-based) method for light absorbing semiconductor film formation suitable for ultrahigh throughput production. The ink is based on a hybrid precursor containing at least a dissolved component and at least a solid component (particles) whereas elements from both components are incorporated into the final film composition by a reactive anneal. The dissolved component provides effective binding media surrounding the particles while the particles have stress-relief and crack-deflection effect permitting the deposition of thicker films in a single coating.

The present invention provides a method for coating a substrate with a Cu—Zn—Sn—(S,Se) based compound film. The method is suitable for ultrahigh-throughput fabrication and overcomes the disadvantages associated with the prior art by:

Forming a hybrid precursor ink composed of both solid (particle-based) and dissolved precursor component in a suitable liquid media (solvent), where both the solid and dissolved components preferably contain metal atoms and both are aimed to be substantially incorporated into a final nominally single-phase composition;

Coating and drying the hybrid precursor ink on a substrate to produce a coated substrate. As the solvent(s) evaporate, dissolved components act as binders forming continuous media around the solid particles, which in turn, as non-compressible components have stress-relief and crack-deflecting effect, permitting the formation of a thicker layer in single coating; and Heating the coated substrate in a desired atmosphere to induce chemical reaction between the precursor particles and the binding (formerly dissolved) precursor component. The intimate contact between the two phases provides conditions for homogeneous reaction yielding a substantially single-phase film. In specific embodiments, the atmosphere may contain additional reactants, e.g., sulfur or selenium or compounds thereof.

The obtained film on a substrate can further be used for diverse applications, including improved photovoltaic devices.

A specific embodiment of the invention provides Cu—Zn—Sn—S(Se) compound films and high-efficiency photovoltaic devices based on these compounds.

The ink, or functional liquid used to deposit an inorganic, substantially single-phase compound film by a liquid-coating method includes at least one of each 3 following categories:
Solvent, Including a Mixture of Solvents:

The solvent can be water or non-aqueous liquid, the second being either organic or inorganic liquid. Preferably, the solvent can be substantially eliminated by evaporation, i.e., it has sufficient vapor pressure below its decomposition temperature and/or upon thermal anneal that it is substantially converted to gas phase and does not leave residual contamination of elements foreign to the targeted composition.

In the specific embodiment where a non-oxide (e.g., selenide, sulfide, phosphide, nitride, telluride) compound is targeted, particularly when anneals in oxidation atmosphere are undesirable, the solvent and its coordination compounds with the dissolved component preferably do not retain carbon or oxygen, except in the cases when this is strictly desirable.

In one specific embodiment, the solvent, for example hydrazine, does not contain carbon or oxygen elements. Other examples of solvents include but are not limited to: alcohols, ethers, glycols, aldehydes, ketones, alkanes, amines, dimethylsulfoxide (DMSO), cyclic compounds, halogenated organic compounds;
Dissolved Components:

The dissolved components preferably include Cu, and Sn in combination with S and/or Se in total concentration of from about 5 to about 1000 mg/ml. Optionally, the dissolved components include an element, selected from the group: Li, Na, K, Mg, Ca, Sr, Ba, Sb, Bi, and B; and
Solid Component:

The solid components, referred to herein as "particles," are defined as solid structures of crystalline or amorphous nature are dispersed in the solvent. The solid components are detectable by any analytical technique know to those skilled in the art, and include techniques, such as, but not limited to, x-ray diffraction; optical (laser) scattering; and optical, electron or atomic force microscopy.

Preferably the particles are in concentration from about 5 to about 1000 mg/ml.

The particle size preferably is from about 2 nm to about 2000 nm and ranges therebetween. More preferably, the particle size is from about 10 nm to about 1000 nm and most preferably, the particle size is from about 10 nm to about to about 500 nm.

In a preferred embodiment, the dimensions of these particles are represented by the formula:

$$d \geq 2e$$

wherein d is at least one dimension of the particles; and e is any other dimension of the particles.

The particles may be of various shapes, e.g., elongated, spherical, rod-like, planar, cubic, tetrapod, flake-like etc., and of various sizes, e.g., 2 nm-100 micron, or otherwise they can be nanoparticles and/or microparticles. However, preferably, the particle size is smaller than the thickness of the film being deposited.

The particles can be prepared by any standard technique known to the skilled in the art, such as, but not limited to, solution-based, e.g., controlled precipitation, sol-gel, wet atomization, gas-phase reactions, optical, e.g., laser ablation, electrical, e.g., electro explosion, plasma jet, electric arc, or mechanical, e.g., grinding, ablation, milling, and water-jet.

Optionally, the particles can contain an element selected from the group: Li, Na, K, Mg, Ca, Sr, Ba, Sb, and Bi.

An advantage of the process is the possibility to deposit highly pure semiconductor layers by printing techniques without the necessity to use organic enhancers, such as, polymeric binders known to produce carbon and/or oxygen contamination upon thermal decomposition. A specific embodiment of the invention is a Cu—Zn—Sn—Se—S based film deposited by use of the hybrid ink and an improved photovoltaic cell base on the film.

Another advantage of the present invention is to avoid or reduce the necessity of enhancing additives, in particular organic polymers acting as binders, surfactants and/or extenders, as their function can be substantially engineered by adequate introduction of desirable dissolved components that are subsequently incorporated into the final composition.

Nevertheless, in cases where additive use is desirable or in cases where such additives can be conveniently eliminated, e.g., by thermal anneal in oxidizing atmosphere when oxide materials are targeted, these can be readily used. Therefore, in addition to the above 3 principle components the ink may optionally contain enhancing additives that improve the dispersion of the solid phase and/or the solubility of the liquid phase and/or the rheological properties of the ink.

Some non-limiting examples of such additives include: binders, viscosity modifiers, pH modifiers, dispersants, wetting agents and/or solubility enhancers, such as, polymers, surface active compounds, complex forming agents, e.g., amines, and acidic and basic substances.

The deposition of the prepared ink on a substrate can be accomplished by forming a liquid layer of the ink by any standard liquid-coating technique, such as, but not limited to, spin coating, dip coating, doctor blading, curtain coating, slide coating, spraying, slit casting, meniscus coating, screen printing, ink jet printing, pad printing, flexography, and gravure printing.

The substrate may be made of glass, metal, ceramics, polymers, or a combination thereof including composite materials. In one embodiment the substrate is metal or alloy foil containing as non-limiting examples molybdenum, aluminum, titanium, iron, copper, tungsten, steel or combinations thereof. In another embodiment the metal or alloy foil is coated with an ion diffusion barrier and/or an insulating layer succeeded by a conductive layer. In another embodiment the substrate is polymeric foil with a metallic or other conductive layer, e.g., transparent conductive oxide, carbon) deposited on the top of it. In one preferred embodiment, regardless of the nature of the underlying substrate material or materials, the surface contacting the liquid layer contains molybdenum.

After a liquid layer of the ink is deposited on the surface of the substrate, the solvent is subjected to evaporation by means of exposure to ambient or controlled atmosphere or vacuum that may be accompanied with a thermal treatment, referred to as preliminary anneal, to fabricate substrate coated with a hybrid precursor including discrete particles and surrounding media. This surrounding media is formed by solidification of the dissolved component.

The substrate thus coated with a hybrid precursor is then subjected to recrystallization or reactive anneal producing a nominally single-phase material. The nominally single-phase material preferably contains at least 80% of the targeted compound, more preferably at least 90% and even more preferably at least 95% by mass of the targeted compound.

The reactive anneal can be carried out in inert, e.g., nitrogen, helium or argon, atmosphere or reactive atmosphere inducing oxidation, reduction or otherwise introduction or elimination of a specific element into the final composition. The reactive atmosphere may contain as non-limiting examples S and Se. The thermal anneal is carried at temperatures from about 200° C. to about 800° C., preferably from about 400° C. to about 600° C. Most preferably, the anneal temperature is from about 500 to about 600° C.

The preliminary and/or reactive anneal can be carried our by any technique known to the skilled in the art, including but not limited to: furnace, hot plate, infrared or visible radiation, e.g., laser, lamp furnace, rapid thermal anneal unit, resistive heating of the substrate, heated gas stream, flame burner, electric arc and plasma jet. The duration of this anneal can vary depending on the process and typically is from about 0.1 sec. to about 72 hr.

The intimate contact between the two components of the hybrid precursor for most embodiments allows to limit the anneal duration to less than 30 min.

The obtained film on substrate may then be used for the desired application, such as, optical, electrical, anti-friction, bactericidal, catalytic, photo-catalytic, electromagnetic shielding, wear-resistance, and diffusion barrier.

Example 1

Preparation of $Cu_2ZnSn(S,Se)_4$ Film

All operations were performed in nitrogen-filled glove box. The deposition solution was prepared in two parts in glass vials under magnetic stirring: A1, by dissolving $Cu_2S$, 0.573 g and sulfur, 0.232 g in 3 ml of hydrazine and B1, by mixing SnSe, 0.790 g, Se, 1.736 g and Zn, 0.32 g with 7 ml of hydrazine. After 3 days under magnetic stirring, solution A had an orange transparent aspect, while B1 was dark green and opaque. Solutions A1 and B1 were mixed (C1) before deposition.

Figure 2:
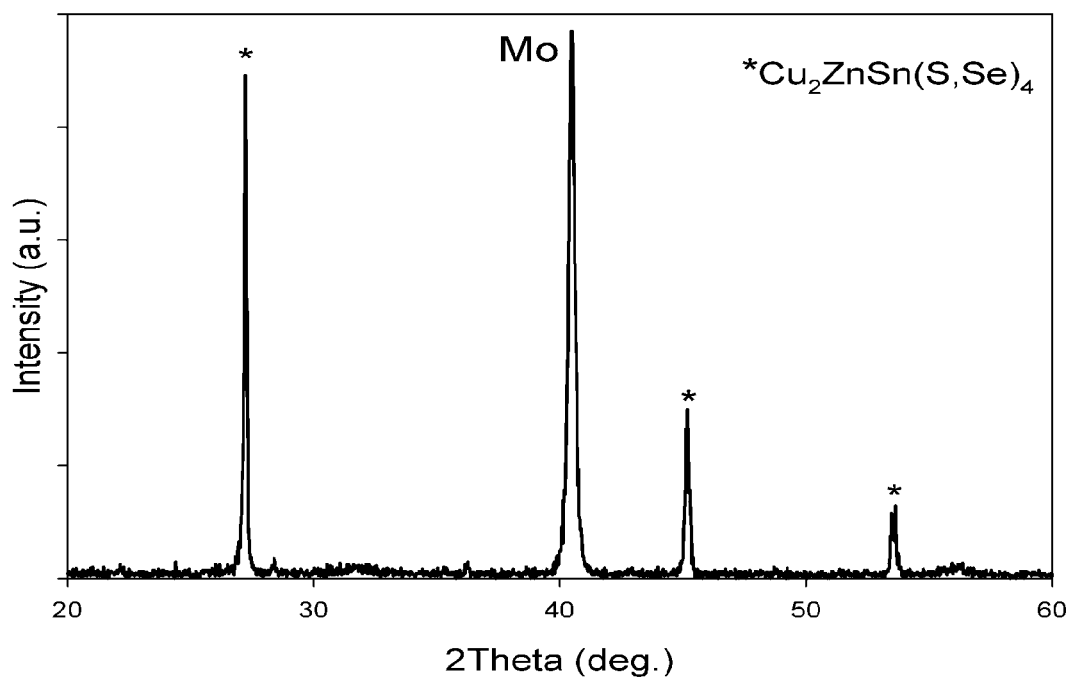
FIG. 2 shows an X-ray diffraction pattern of CZTSe film prepared on molybdenum-coated glass substrate according to Example 1.
Figure 3:
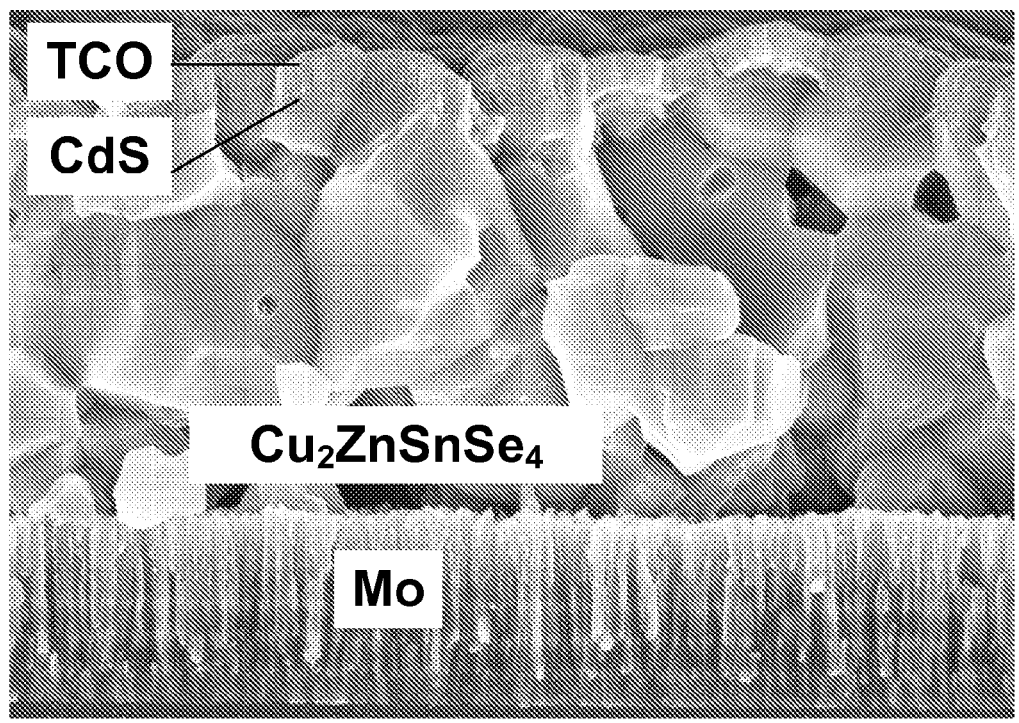
FIG. 3 is Scanning electron microscopy image of CZTSe kesterite film of Example 1 in a solar cell prepared according to Example 3.

A sample of the mixed solution was filtered through a syringe filter and the filtered particles were observed by Transmission Electron Microscopy (FIG. 1). Particles are elongated with dimensions that can be represented by the formula $d \geq 2e$ wherein d is at least one dimension of the particles and e is any other dimension of the particles. For example, where d can be the length and e can be the width. EDX analysis confirmed presence of Zn and Se in the solid particles and the X-ray powder diffraction pattern matched that for $ZnSeN_2H_4$, JCPDS 37-0619 (FIG. 2).

Films were deposited on soda lime glass substrates coated with 700 nm molybdenum by spin coating at 800 rpm and heated at 540° C. for 2 minutes. The coating and heating cycle was repeated 5 times before a final anneal was carried out for 10 minutes.

Example 2

Preparation of $Cu_2ZnSn(S,Se)_4$ Film

Repeating the procedure of Example 1, atmosphere containing elemental sulfur vapor (0.12 g/l N2) was used for the final anneal.

Example 3

Photovoltaic Devices Prepared by the Method of the Present Invention

Solar cells were fabricated from the above-described Cu2ZnSn(Se,S)4 films by deposition of 60 nm CdS buffer layer by chemical bath deposition, 100 nm insulating ZnO and 130 nm ITO (indium-doped zinc oxide) by sputtering (FIG. 2). In addition to the shown structure, Ni/Al metal contacts and 110 nm MgF coatings were deposited by electron-beam evaporation.

Figure 4:
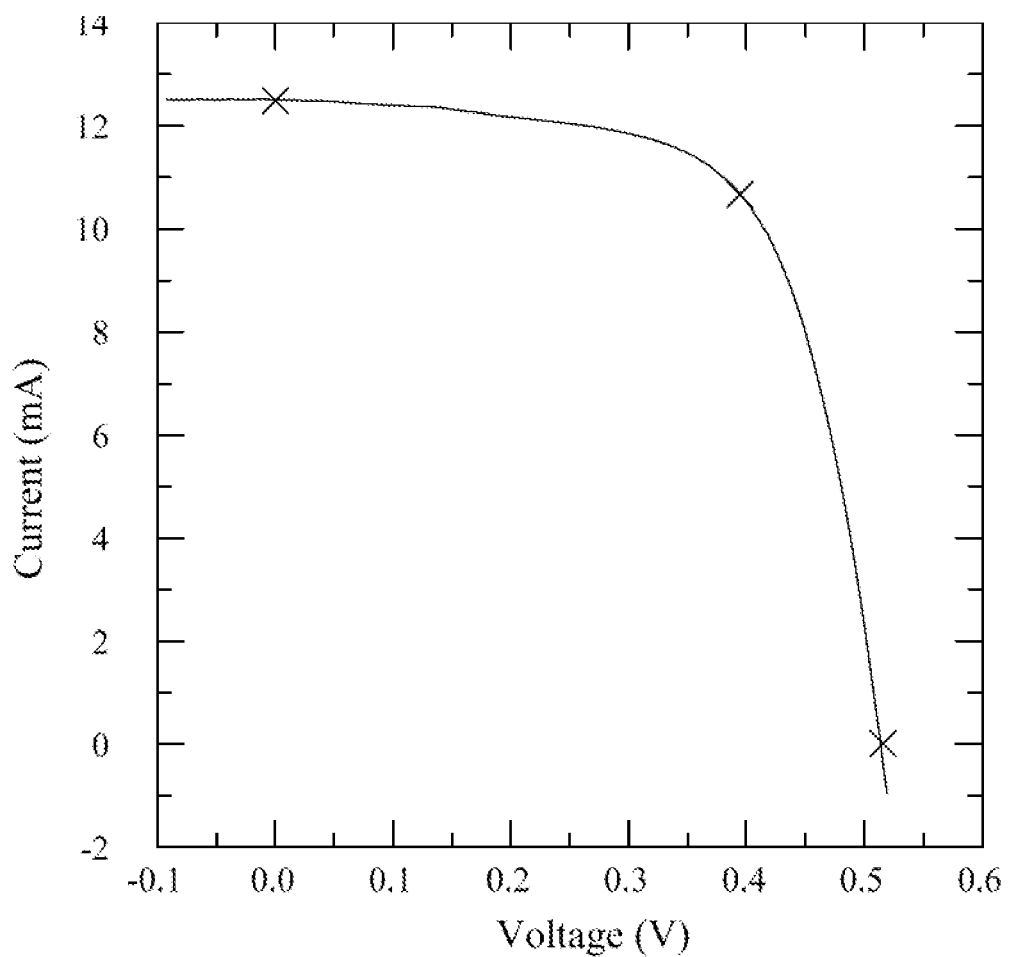
FIG. 4 depicts the Current-voltage curve of a CZTSe solar cell, prepared according to Example 3, having Voc=0.5160 V, Isc=12.481 mA, Jsc=28.612 mA/cm2, Fill Factor=65.43%.

Photovoltaic performance was measured (NREL CERTIFIED, FIG. 4) under ASTM G173 global spectrum, yielding 9.3% efficiency with films prepared according to Example 1 and 9.66% total area, including metal contacts, i.e., about 5% of the total area, conversion efficiency with films prepared according to example 2, with Voc=0.5160 V, Isc=12.481 mA, Jsc=28.612 mA/cm2, Fill Factor=65.43% (FIG. 4).

The potential advantage of this process is that it would be much lower cost than the traditional approaches. This performance is a world record for the category of indium and cadmium-free photovoltaic absorbers deposited by any method, including vacuum-based and makes this material already eligible for commercial consideration.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A photovoltaic device, comprising:
a top electrode having transparent conductive material;
an n-type semiconducting layer;
a substrate having an electrically conductive surface; and
an annealed hybrid precursor ink on the substrate formed by contacting hydrazine, a source of Cu, a source of Sn, a source of at least one of S and Se, and a source of Zn in an aqueous solvent forming, in situ, an aqueous dispersion containing solid particles and dissolved components to form a thin layer on the substrate; and annealing at a temperature, pressure, and length of time sufficient to form a single phase kesterite film, wherein the kesterite film is free of carbon and/or oxygen and contains at least 80% of a compound of the formula:

$$Cu_{2-x}Zn_{1+y}Sn(S_{1-z}Se_z)_{4+q}$$

wherein $0 \leq x \leq 1$; $0 \leq y \leq 1$; $0 \leq z \leq 1$; $-1 \leq q \leq 1$, and wherein the photovoltaic device has a photovoltaic efficiency of at least 9.3 percent as measured in accordance with ASTM G173.

2. The photovoltaic device of claim 1, wherein:
said substrate is coated with a molybdenum layer and is selected from the group consisting of: glass, plastic, polymer, ceramic, and aluminum foil;
said n-type semiconducting layer has at least one of: ZnS, CdS, InS, oxides thereof, and selenides thereof;
said transparent conductive material is selected from the group consisting of: doped ZnO, Indium-tin oxide, doped tin oxide, and carbon nanotubes.

3. The photovoltaic device of claim 1, comprising: a plurality of electrically interconnected photovoltaic devices forming a photovoltaic module.

4. A photovoltaic device, comprising:
a top electrode having transparent conductive material;
an n-type semiconducting layer;
a substrate having an electrically conductive surface containing molybdenum; and
an annealed hybrid precursor ink on the electrically conductive surface containing the molybdenum overlaying and in contact with the electrically conductive surface containing the molybdenum, wherein the annealed hybrid precursor ink is formed by contacting hydrazine, a source of Cu, a source of Sn, a source of S and a source of Se, and a source of Zn in an aqueous solvent forming an aqueous dispersion comprising dissolved components and Zn containing solid particles, to form a layer on the substrate; and annealing at a temperature, pressure, and length of time sufficient to form a single phase kesterite film, wherein the kesterite film is free of carbon and/or oxygen and contains at least 80% of a compound of the formula:

$$Cu_{2-x}Zn_{1+y}Sn(S_{1-z}Se_z)_{4+q}$$

wherein $0 \leq x \leq 1$; $0 \leq y \leq 1$; $0 < z \leq 1$; $-1 \leq q \leq 1$, and wherein the photovoltaic device has a photovoltaic efficiency of at least 9.3 percent as measured in accordance with ASTM G173.

* * * * *